United States Patent
Yamamoto et al.

(10) Patent No.: US 9,662,680 B2
(45) Date of Patent: May 30, 2017

(54) ULTRASONIC TRANSDUCER

(71) Applicant: MURATA MANUFACTURING CO., LTD., Nagaokakyo-Shi, Kyoto-fu (JP)

(72) Inventors: Hironari Yamamoto, Nagaokakyo (JP); Akihiro Mitani, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 376 days.

(21) Appl. No.: 14/163,307

(22) Filed: Jan. 24, 2014

(65) Prior Publication Data
US 2014/0139071 A1 May 22, 2014

Related U.S. Application Data

(63) Continuation of application No. PCT/JP2012/068666, filed on Jul. 24, 2012.

(30) Foreign Application Priority Data

Aug. 3, 2011 (JP) ................. 2011-170230

(51) Int. Cl.
*B06B 1/06* (2006.01)
*G10K 9/122* (2006.01)
(Continued)

(52) U.S. Cl.
CPC .......... *B06B 1/0607* (2013.01); *B06B 1/0603* (2013.01); *G10K 9/122* (2013.01);
(Continued)

(58) Field of Classification Search
CPC ... H01L 41/047; B06B 1/0603; B06B 1/0607; G10K 9/122; G10K 9/22
(Continued)

(56) References Cited

U.S. PATENT DOCUMENTS

| 4,700,177 A * | 10/1987 | Nakashima | G10K 9/122 116/142 R |
| 2007/0228893 A1* | 10/2007 | Yamauchi | G10K 9/122 310/348 |
| 2009/0260422 A1 | 10/2009 | Sugiura et al. | |

FOREIGN PATENT DOCUMENTS

| JP | 2001-258098 A | 9/2001 |
| JP | 2004-104481 A | 4/2004 |
| JP | 2009-267510 A | 11/2009 |

OTHER PUBLICATIONS

Written Opinion and International Search Report issued in PCT/JP2012/068666 mailed on Nov. 6, 2012.

* cited by examiner

*Primary Examiner* — Derek Rosenau
(74) *Attorney, Agent, or Firm* — Arent Fox LLP

(57) ABSTRACT

An ultrasonic transducer is provided that includes an ultrasonic wave generator having piezoelectric vibrators, and cases having ultrasonic wave emission holes and accommodating the ultrasonic wave generator. Acoustic paths in which air serves as a medium are formed by the ultrasonic wave generator and the and extend from the piezoelectric vibrators to the ultrasonic wave emission holes. Resonance of air is generated in the acoustic paths by ultrasonic waves generated by the piezoelectric vibrators in which the ultrasonic wave emission holes are open ends of the resonance. The piezoelectric vibrators are driven at a driving frequency at which the temperature-sound pressure characteristic for the resonance of air and the temperature-amplitude characteristic at the driving frequency of the piezoelectric vibrators have opposite tendencies.

21 Claims, 13 Drawing Sheets

(51) Int. Cl.
   *G10K 9/22*   (2006.01)
   *G10K 11/00*  (2006.01)
   *H01L 41/047* (2006.01)
(52) U.S. Cl.
   CPC .............. *G10K 9/22* (2013.01); *G10K 11/004* (2013.01); *H01L 41/047* (2013.01)
(58) Field of Classification Search
   USPC ................................................ 310/322, 334
   See application file for complete search history.

(A)

(B)

200

PRIOR ART

ULTRASONIC TRANSDUCER

CROSS-REFERENCE TO RELATED APPLICATIONS

The present application is a continuation of PCT/JP2012/068666 filed Jul. 24, 2012, which claims priority to Japanese Patent Application No. 2011-170230, filed Aug. 3, 2011, the entire contents of each of which are incorporated herein by reference.

FIELD OF THE INVENTION

The present invention relates to ultrasonic transducers and more specifically relates to ultrasonic transducers that have an excellent temperature-sound pressure characteristic.

BACKGROUND OF THE INVENTION

The temperature-sound pressure characteristic is extremely important in ultrasonic transducers used in ultrasonic sensors and so forth. This is because even if a sufficient output sound pressure is provided at a certain temperature, the output sound pressure may decrease when the temperature changes and an ultrasonic wave may no longer arrive at the target and as a result the applications in which such ultrasonic transducers can be used is limited. For example, it has not been possible to use an ultrasonic transducer having a poor temperature-sound pressure characteristic in a car-mounted ultrasonic sensor for distance measurement that has to be able to cope with a severe temperature environment.

In FIG. 16, an ultrasonic transducer 400 of the related art is illustrated that is disclosed in Patent Document 1 (Japanese Unexamined Patent Application Publication No. 2001-258098) and that has an improved temperature-sound pressure characteristic. The ultrasonic transducer 400 has a structure in which a piezoelectric vibrator 103 is affixed to a rear surface side of a metal plate 101 with adhesive 102 therebetween and in which conical funnel-shaped resonator (horn) 104 is attached to the front surface side of the metal plate 101. After providing cushioning material 105 on the rear surface side of the piezoelectric vibrator 103 the entire device is accommodated inside a case composed of a base member 106 and a cover 107.

In the ultrasonic transducer 400, in order to achieve an improvement in the temperature-sound pressure characteristic, the coefficient of linear expansion of the adhesive 102 is made to be larger than the coefficient of linear expansion of the piezoelectric vibrator 103 and the coefficient of linear expansion of the metal plate 101 is made to be smaller than the coefficient of linear expansion of the piezoelectric vibrator 103. In the ultrasonic transducer 400, expansion of the adhesive 102 that occurs with a change in temperature is suppressed by the metal plate 101 and as a result stress that would cause deformation that would lead to warping of the piezoelectric vibrator 103 is reduced and therefore the size of a change in frequency caused by a change in temperature is reduced and the temperature-sound pressure characteristic is improved.

Patent Document 1: Japanese Unexamined Patent Application Publication No. 2001-258098

In the above-described ultrasonic transducer 400 of the related art, the coefficients of linear expansion of the piezoelectric vibrator 103, the metal plate 101 and the adhesive 102 are adjusted with respect to each other, the adhesive 102 adhering the piezoelectric vibrator 103 and the metal plate 101 to each other, and as a result stress acting on the piezoelectric vibrator 103 is reduced and it is considered that there is some effect of improving the temperature-sound pressure characteristic. However, in the ultrasonic transducer 400, since measures have not been taken with respect to temperature characteristics of the resonant frequency, mechanical quality coefficient (Qm), electrostatic capacity, piezoelectric constant (d constant) and so forth of the piezoelectric vibrator 103 itself, significant improvements in the temperature-sound pressure characteristic have not been achieved.

SUMMARY OF THE INVENTION

The present invention was made in order to solve the problem possessed by the above-described ultrasonic transducer of the related art. As means for solving this problem, an ultrasonic transducer of the present invention includes an ultrasonic wave generator having a piezoelectric vibrator, and a case having an ultrasonic wave emission hole and accommodating the ultrasonic wave generator. An acoustic path in which air serves as a medium is formed by the ultrasonic wave generator and the case and extends from the piezoelectric vibrator to the ultrasonic wave emission hole. Resonance of air is generated in the acoustic path by an ultrasonic wave generated by the piezoelectric vibrator in which the ultrasonic wave emission hole is an open end of the resonance. The piezoelectric vibrator is driven at a driving frequency at which a temperature-sound pressure characteristic for the resonance of air and a temperature-amplitude characteristic at the driving frequency of the piezoelectric vibrator have opposite tendencies. The resonance of air for example may be resonance of $\lambda/4$.

The driving frequency of the piezoelectric vibrator may be shifted away from the frequency at which the sound pressure of the resonance of air at 25° C. has a peak. For example, although, basically speaking, it is effective to make the driving frequency of the piezoelectric vibrator be equal to the frequency at which the sound pressure of resonance of air at 25° C. has a peak value when the piezoelectric transducer is to be used at 25° C., which is room temperature, an improvement in the temperature-sound pressure characteristic can still be achieved at other frequencies despite a drop in effectiveness.

A configuration may be adopted in which the ultrasonic wave generator is composed of a first piezoelectric vibrator having a plate-like shape and bonded to one main surface of a frame and a second piezoelectric vibrator having a plate-like shape and bonded to another main surface of the frame, the first piezoelectric vibrator and the second piezoelectric vibrator are driven in a buckling tuning fork vibration mode in which they vibrate with opposite phases to each other at the same frequency, and the acoustic path includes a first acoustic path that extends from the first piezoelectric vibrator to the ultrasonic wave emission hole and a second acoustic path that extends from the second piezoelectric vibrator to the ultrasonic wave emission hole. With this configuration, resonance of air in the first acoustic path and resonance of air in the second acoustic path are superposed with each other and output and therefore the output sound pressure can be increased.

In the ultrasonic transducer of the present invention having the above-described configuration, the piezoelectric vibrator is driven at a driving frequency at which a temperature-sound pressure characteristic for resonance of air and a temperature-amplitude characteristic at the driving frequency of the piezoelectric vibrator have opposite tendencies and therefore the ultrasonic transducer has a very excellent temperature-sound pressure characteristic. Consequently, the ultrasonic transducer of the present invention can exhibit a staple output sound pressure over a wide temperature range.

DESCRIPTION OF EMBODIMENTS OF THE PREFERRED EMBODIMENTS OF THE INVENTION

Hereafter, modes for carrying out the present invention will be described with use of the drawings.

First Embodiment

Figure 1:
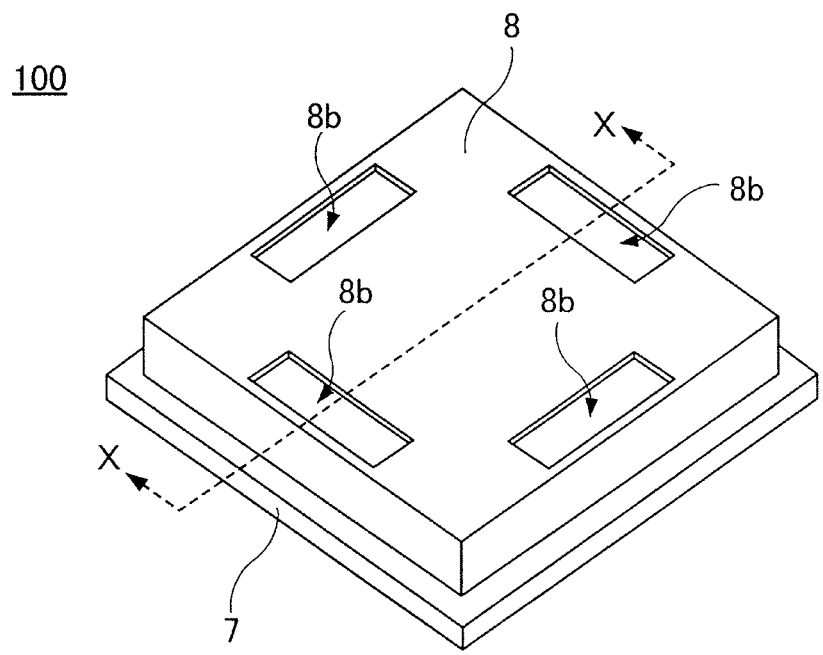
FIG. 1 is a perspective view illustrating an ultrasonic transducer 100 according to a first embodiment of the present invention.
Figure 2:
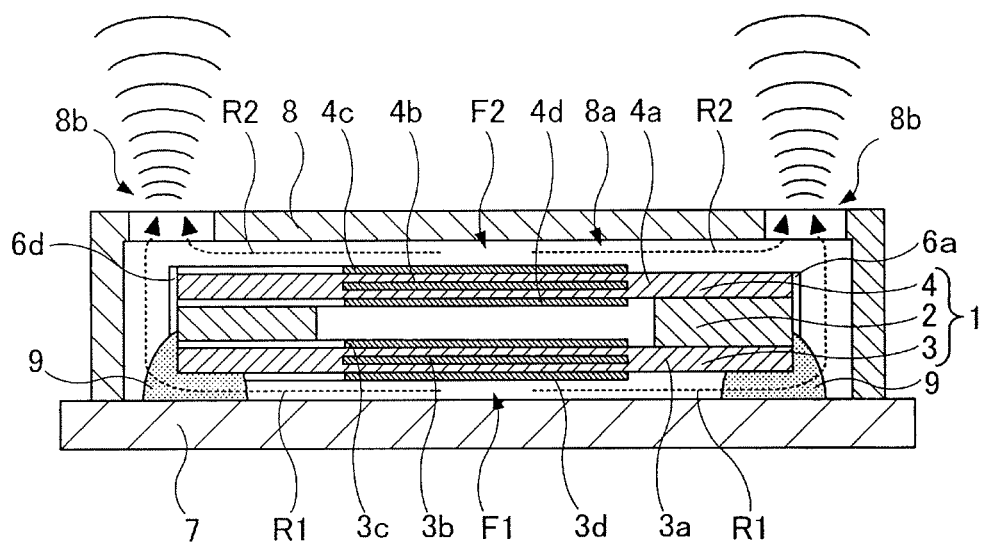
FIG. 2 is a sectional view illustrating a portion of the ultrasonic transducer 100 according to the first embodiment of the present invention taken along the chain line X-X in FIG. 1.
Figure 3:
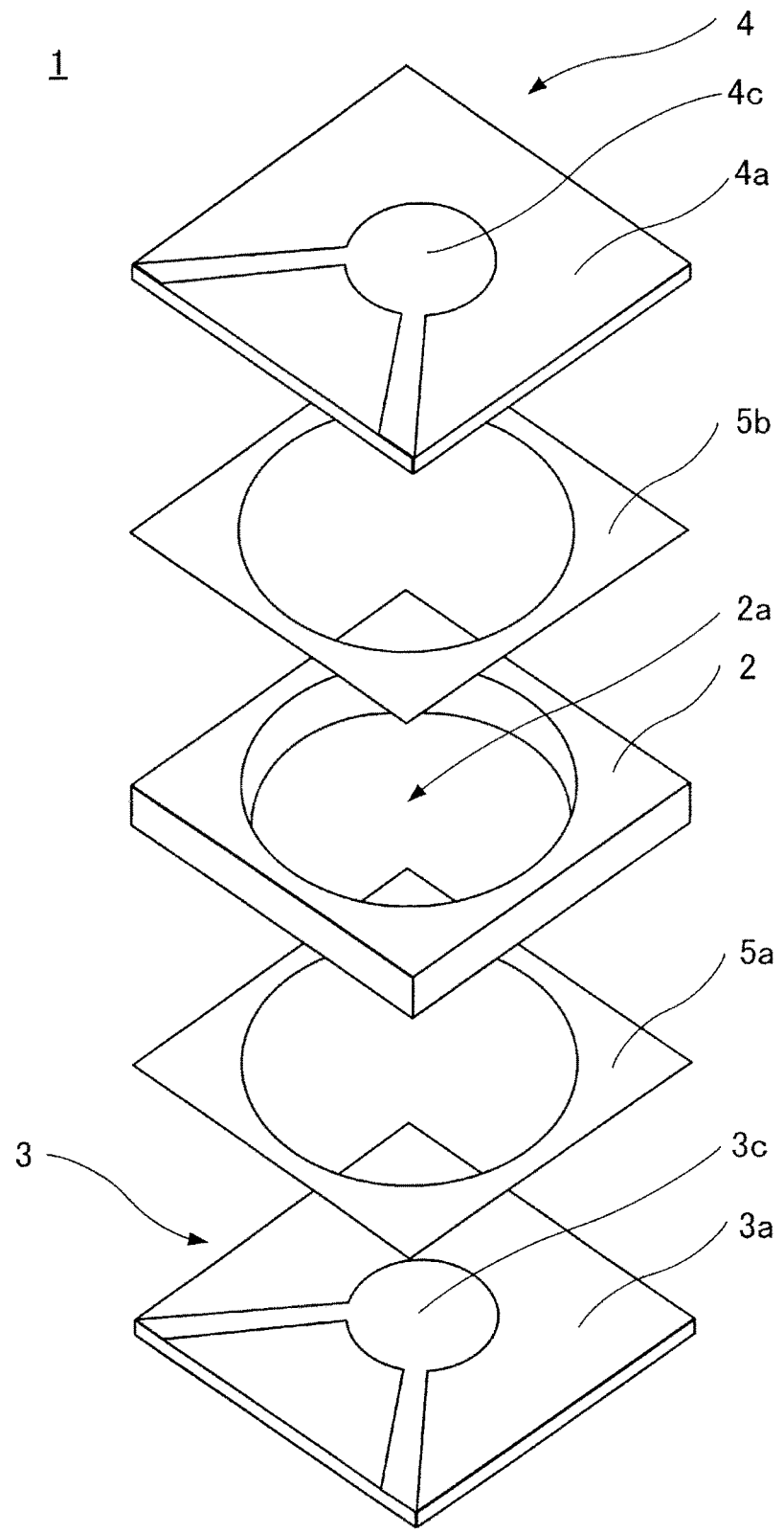
FIG. 3 is an exploded perspective view illustrating an ultrasonic wave generator 1 (first piezoelectric vibrator 3 and second piezoelectric vibrator 4) used in the ultrasonic transducer 100 according to the first embodiment of the present invention.

An ultrasonic transducer 100 according to a first embodiment of the present invention is illustrated in FIG. 1 and FIG. 2. Here, FIG. 1 is a perspective view, and FIG. 2 is a sectional view of a portion taken along the chain line X-X in FIG. 1. In addition, an ultrasonic wave generator 1 employed in the ultrasonic transducer 100 is illustrated in FIG. 3. Here, FIG. 3 is an exploded perspective view.

The ultrasonic transducer 100 includes the ultrasonic wave generator 1.

The ultrasonic wave generator 1 includes a frame 2, a first piezoelectric vibrator 3 and a second piezoelectric vibrator 4. The frame 2 has a through hole 2a with a diameter on the order of 2.4 mm formed in a center portion thereof and is composed of for example a ceramic body with a thickness on the order of 200 μm. The ultrasonic wave generator 1 has a square planar shape with sides with a length of 2.8 mm and has a thickness of 0.32 mm.

The first piezoelectric vibrator 3, which is a bimorph-type piezoelectric vibrator, is attached to one main surface (lower main surface) of the frame 2 with adhesive 5a and the second piezoelectric vibrator 4, which is a bimorph-type piezoelectric vibrator, is attached to the other main surface (upper main surface) of the frame 2 with adhesive 5b. That is, the through hole 2a of the frame 2 is closed by the first bimorph-type piezoelectric vibrator 3 and the second bimorph-type piezoelectric vibrator 4.

The first piezoelectric vibrator 3 includes a rectangular plate-shaped piezoelectric ceramic body 3a composed of for example lead zirconate titanate (PZT). An internal electrode 3b, which is composed of for example Ag or Pd, is formed inside the piezoelectric ceramic body 3a and external electrodes 3c and 3d composed of the same material such as Ag are formed on the two main surfaces of the piezoelectric ceramic body 3a. The internal electrode 3b is led out to two adjacent corner portions of the piezoelectric ceramic body 3a. The external electrodes 3c and 3d are respectively led out to two adjacent corner portions of the piezoelectric ceramic body 3a to which the internal electrode 3b is not led out. The thickness of the first piezoelectric vibrator 3 is on the order of for example 60 μm.

The second piezoelectric vibrator 4, similarly to the first piezoelectric vibrator 3, includes a rectangular plate-shaped piezoelectric ceramic body 4a that is composed of for example PZT, and an internal electrode 4b that is composed of for example Ag or Pd is formed inside the piezoelectric ceramic body 4a and external electrodes 4c and 4d composed of for example Ag are formed on the two main surfaces of the piezoelectric ceramic body 4a. The internal electrode 4b is led out to two adjacent corner portions of the piezoelectric ceramic body 4a. The external electrodes 4c and 4d are led out to two adjacent corner portions of the piezoelectric ceramic body 4a to which the internal electrode 4b is not led out. The thickness of the second piezoelectric vibrator 4 is also on the order of for example 60 μm.

The inside of the piezoelectric ceramic body 3a of the first piezoelectric vibrator 3 and the inside of the piezoelectric ceramic body 4a of the second piezoelectric vibrator 4 are polarized. In the piezoelectric ceramic body 3a, the direction of polarization between the external electrode 3c and the internal electrode 3b and the direction of polarization between the internal electrode 3b and the external electrode 3d are the same. Similarly, in the piezoelectric ceramic body 4a, the direction of polarization between the external electrode 4c and the internal electrode 4b and the direction of polarization between the internal electrode 4b and the external electrode 4d are the same. However, the direction of polarization between the external electrode 3c and the internal electrode 3b and between the internal electrode 3b and the external electrode 3d of the piezoelectric ceramic body 3a is opposite to the direction of polarization between the external electrode 4c and the internal electrode 4b and between the internal electrode 4b and the external electrode 4d of the piezoelectric ceramic body 4a.

Extraction electrodes are formed at the four corner portions of the ultrasonic wave generator 1. The two adjacent extraction electrodes (only electrode 6a is shown in the cross sectional view of FIG. 2) are each electrically connected to the internal electrode 3b of the piezoelectric ceramic body 3a and the internal electrode 4b of the piezoelectric ceramic body 4a. The remaining adjacent two extraction electrodes (only electrode 6d is shown in the cross sectional view of FIG. 2) are each electrically connected to the external electrodes 3c and 3d of the piezoelectric ceramic body 3a and to the external electrodes 4c and 4d of the piezoelectric ceramic body 4a. (The extraction electrodes 6a and 6d are illustrated in FIG. 2 but illustration of the other extraction electrodes is omitted from all of the figures since they are sectional views.) The extraction electrodes are for example composed of Ag.

Figure 4:
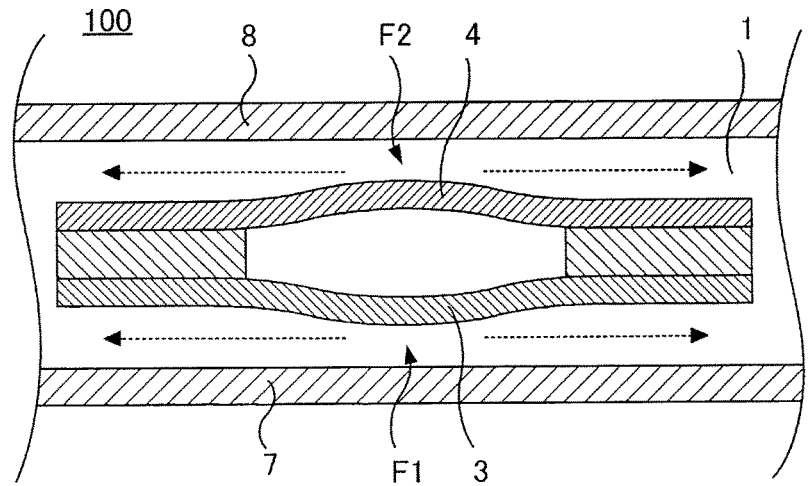
FIG. 4 shows explanatory diagrams illustrating a driven state of the ultrasonic transducer 100 according to the first embodiment of the present invention.
Figure 4:
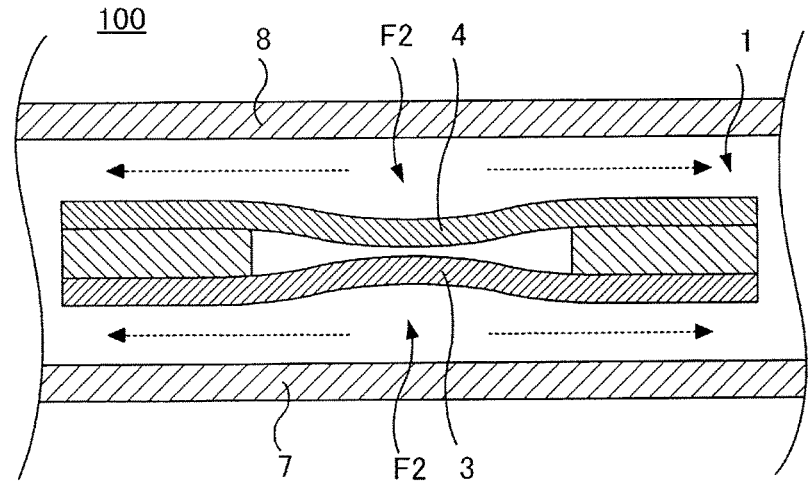

Next, a driven state of the ultrasonic transducer 100 will be described. FIG. 4(A) and FIG. 4(B) illustrate a state in which an alternating current of a certain frequency is applied to the ultrasonic wave generator 1 of the ultrasonic transducer 100. In the ultrasonic transducer 100, the first piezoelectric vibrator 3 and the second piezoelectric vibrator 4, which form the ultrasonic wave generator 1, have the internal electrodes 3b and 4b and external electrodes 3c, 3d, 4c and 4d formed therein as described above and are polarized as described above and therefore they vibrate with opposite phases to each other at the same frequency and reciprocate between the states illustrated in FIG. 4(A) and FIG. 4(B) in response to application of an alternating current voltage. That is, the ultrasonic wave generator 1 is driven using a buckling tuning fork vibration mode and ultrasonic waves are emitted from the first piezoelectric vibrator 3 and the second piezoelectric vibrator 4. In this embodiment, the resonant frequencies of the first piezoelectric vibrator 3 and the second piezoelectric vibrator 4, which make up the ultrasonic wave generator 1, are 60 kHz.

The ultrasonic transducer 100 includes a case that is composed of a base member 7 composed of for example a glass epoxy and a cover member 8 that is composed of for example nickel silver.

The base member 7 has a rectangular plate-like shape. A plurality of land electrodes (not illustrated) are formed on the upper main surface of the base member 7. The extraction electrodes formed at the four corner portions of the ultrasonic wave generator 1 are respectively bonded to these land electrodes with conductive adhesive 9 as small as possible so as not to affect the acoustic paths. (In FIG. 2, the conductive adhesive 9 is not illustrated in cross section but is shaded so as to be easier to see.) In this way, the ultrasonic wave generator 1 is mounted on the base member 7. The base member 7 has a square plate-like shape with sides having a length of 4.0 mm and a thickness of 0.3 mm.

An opening 8a for allowing accommodation of the ultrasonic wave generator 1 is formed in the cover member 8 and ultrasonic wave emission holes 8b through which ultrasonic waves are emitted are formed in a top plate portion of the cover member 8. The shape and the number of the ultrasonic wave emission holes 8b are not limited, and, in this embodiment, four ultrasonic wave emission holes 8b having a rectangular shape in plan view are formed. The periphery of the opening 8a of the cover member 8 is bonded to the upper main surface of the base member 7 with for example adhesive (not illustrated) after the ultrasonic wave generator 1 has been accommodated in the opening 8a of the cover member 8. The cover member 8 has a square planar shape with sides having a length of 3.6 mm and a height of 0.65 mm.

In the ultrasonic transducer 100, acoustic paths in which air serves as a medium are formed by the ultrasonic wave generator 1 and the case composed of the base member 7 and the cover member 8. Specifically, a first acoustic path R1 is formed in which resonance of $\lambda/4$ is generated, where a region of the vibrating surface of the first piezoelectric vibrator 3 at which displacement is greatest is an anti-node F1 of the resonance and the ultrasonic wave emission holes 8b are open ends of the resonance. In addition, a second acoustic path R2 is formed in which resonance of $\lambda/4$ is generated, where a region of the vibrating surface of the second piezoelectric vibrator 4 at which displacement is greatest is an anti-node F2 of the resonance and the ultrasonic wave emission holes 8b are open ends of the resonance. In FIG. 2, the first and second acoustic paths R1 and R2 are indicated by the broken line arrows. In this embodiment, four ultrasonic wave emission holes 8b are formed in the cover member 8 and therefore the first and second acoustic paths R1 and R2 each include four paths in four directions.

The acoustic characteristics of the first and second acoustic paths R1 and R2 can be freely adjusted by altering the heights of the acoustic paths (distances between acoustic wave generator 1 and the base member 7 and the cover member 8), the widths of the acoustic paths, the lengths of the acoustic paths and so forth. The first acoustic path R1 and the second acoustic path R2 have different lengths and therefore a phase difference is generated therebetween, but the difference between the lengths of the acoustic paths is no more than around 320 μm, which is the thickness of the ultrasonic wave generator 1, and therefore there is substantially no difference between the acoustic characteristics of the acoustic paths. That is, an ultrasonic wave emitted by the ultrasonic wave generator 1 has a frequency of 60 kHz, which corresponds to a wavelength of 5.7 mm, and the difference between the lengths of the acoustic paths is on the order of 320 μm, which is equal to or less than 0.06λ for this wavelength, and therefore there is substantially no difference between the acoustic characteristics of the acoustic paths.

In this embodiment, the distance between the ultrasonic wave generator 1 and the base member 7 is 30 μm or more and preferably 100 to 200 μm, and the distance between the ultrasonic wave generator 1 and the cover member 8 is 30 μm or more and preferably 100 to 200 μm. Consequently, the acoustic phases of the ultrasonic waves emitted from the first piezoelectric vibrator 3 and the second piezoelectric vibrator 4 are made to be equal to each other and as a result the sound pressure can be increased.

In the ultrasonic transducer 100, the ultrasonic wave generator 1 (first piezoelectric vibrator 3 and second piezoelectric vibrator 4) is driven, whereby resonance of air of $\lambda/4$ is generated by ultrasonic waves emitted from the first piezoelectric vibrator 3 and ultrasonic waves emitted from the second piezoelectric vibrator 4 in the first acoustic path R1 and the second acoustic path R2, respectively. Then, the resonance of the air in the first acoustic path R1 and the resonance of the air in the second acoustic path R2 are superposed with each other and ultrasonic waves having a high output sound pressure are emitted from the ultrasonic wave emission holes 8b. The frequency at which the ultrasonic wave generator 1 (first piezoelectric vibrator 3 and second piezoelectric vibrator 4) is driven and the frequency of ultrasonic waves generated by the first piezoelectric vibrator 3 and the second piezoelectric vibrator 4 are substantially the same.

Figure 5:
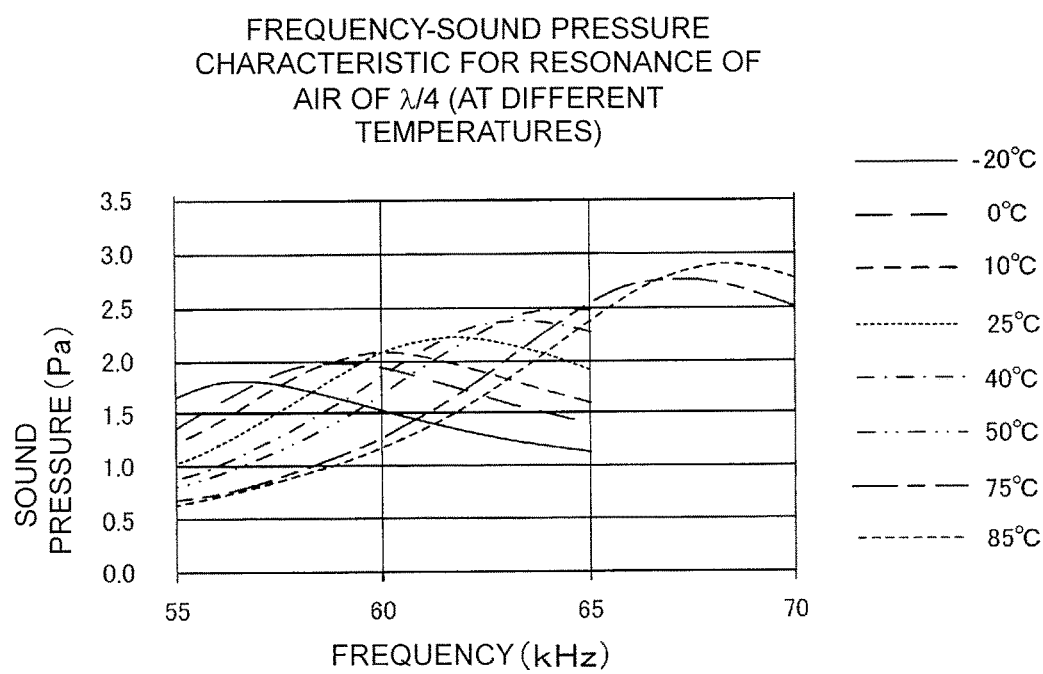
FIG. 5 is a graph illustrating a frequency-sound pressure characteristic for resonance of air of $\lambda/4$.
Figure 6:
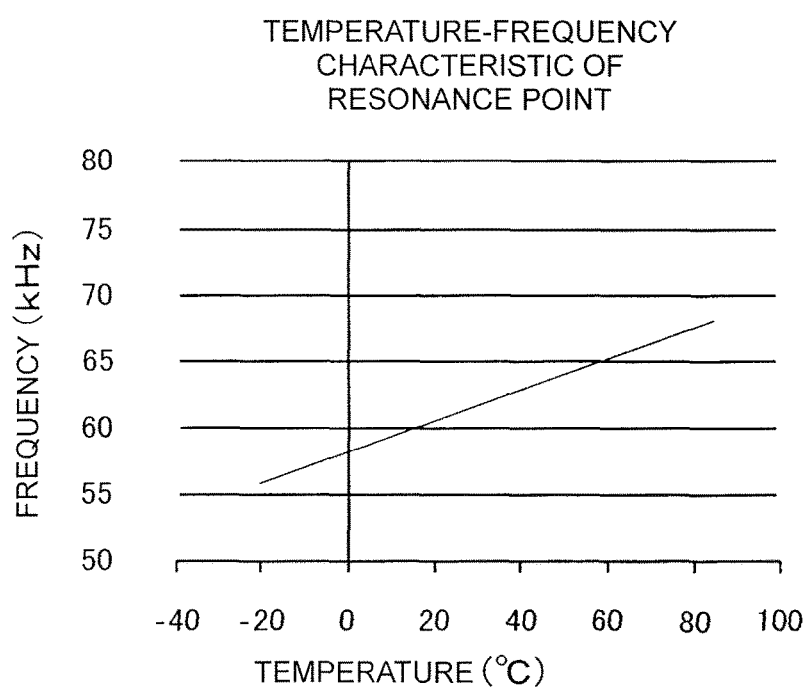
FIG. 6 is a graph illustrating a temperature-frequency characteristic of a resonance point for resonance of air of $\lambda/4$.

The resonance of air is governed by the velocity of sound and the velocity of sound varies with temperature (velocity of sound (m/s)=331.5+0.61 t (t=temperature in degrees centigrade)) and therefore, as illustrated in FIG. 5, the frequency-sound pressure characteristic for the resonance of air of λ/4 exhibits a particular form at each temperature. The frequency-sound pressure characteristic at each temperature has a sound pressure peak at a specific frequency. If we term these peaks resonance points, the temperature-frequency characteristic of these resonance points form a straight line as illustrated in FIG. 6. As is clear from FIG. 6, the resonance point for 25° C. is in the vicinity of 62 kHz and therefore in the case where the ultrasonic transducer 100 is used at 25° C., the sound pressure can be maximized and efficiency is good if the ultrasonic wave generator 1 is driven in the vicinity of 62 kHz.

Figure 7:
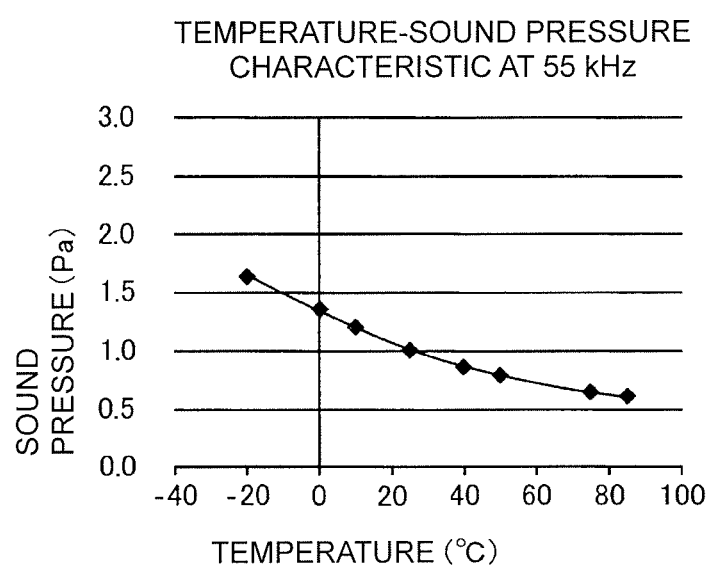
FIG. 7 is a graph illustrating a temperature-sound pressure characteristic for resonance of air of $\lambda/4$ at 55 kHz.
Figure 8:
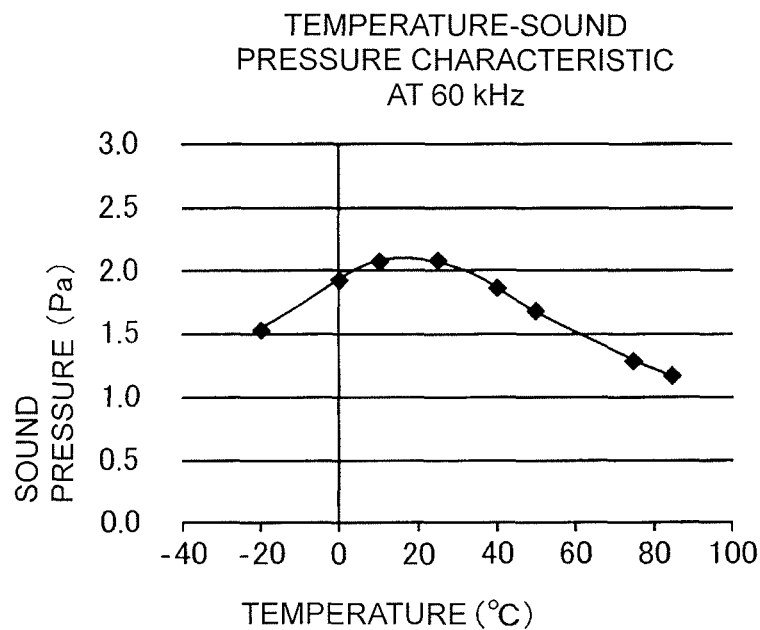
FIG. 8 is a graph illustrating a temperature-sound pressure characteristic for resonance of air of $\lambda/4$ at 60 kHz.
Figure 9:
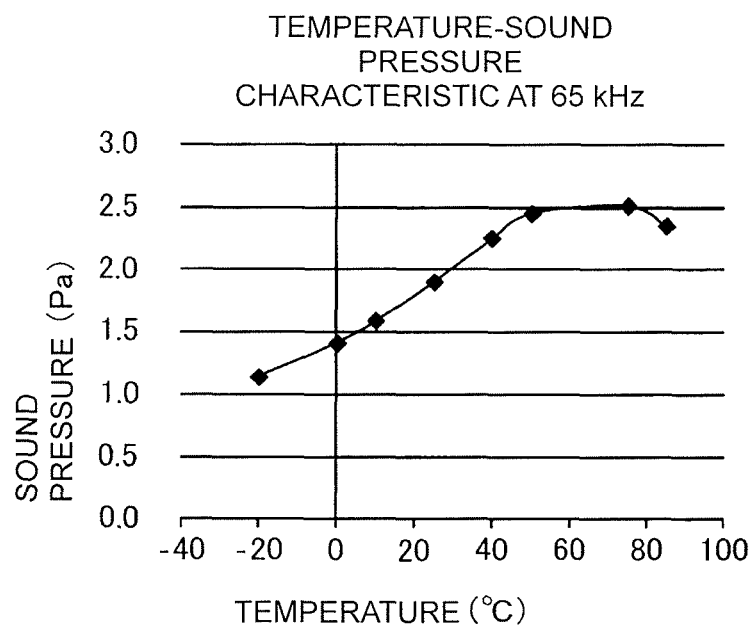
FIG. 9 is a graph illustrating a temperature-sound pressure characteristic for resonance of air of $\lambda/4$ at 65 kHz.

The temperature-sound pressure characteristics for resonance of air of λ/4 at specific frequencies are derived from the frequency-sound pressure characteristics at the different temperatures illustrated in FIG. 5 and are illustrated in FIGS. 7 to 9. Here, FIG. 7 illustrates the temperature-sound pressure characteristic at 55 kHz, FIG. 8 illustrates the temperature-sound pressure characteristic at 60 kHz and FIG. 9 illustrates the temperature-sound pressure characteristic at 65 kHz.

In the temperature-sound pressure characteristic for resonance of air of λ/4 at 55 kHz, as illustrated in FIG. 7, the sound pressure decreases as temperature rises. In this specification, for convenience, this tendency is defined as a "negative (N) tendency".

In the temperature-sound pressure characteristic for resonance of air of λ/4 at 60 kHz, as illustrated in FIG. 8, the sound pressure increases as temperature rises up to a certain temperature (around 20° C.) and then the sound pressure decreases as temperature rises after that certain temperature. In this specification, for convenience, this tendency is defined as a "mountain-shaped tendency".

In the temperature-sound pressure characteristic for resonance of air of λ/4 at 65 kHz, as illustrated in FIG. 9, the sound pressure increases as temperature rises through almost the entire range (from a temperature below 0° C. to a temperature in the vicinity of 80° C.). In this specification, for convenience, this tendency is defined as a "positive (P) tendency".

Figure 10:
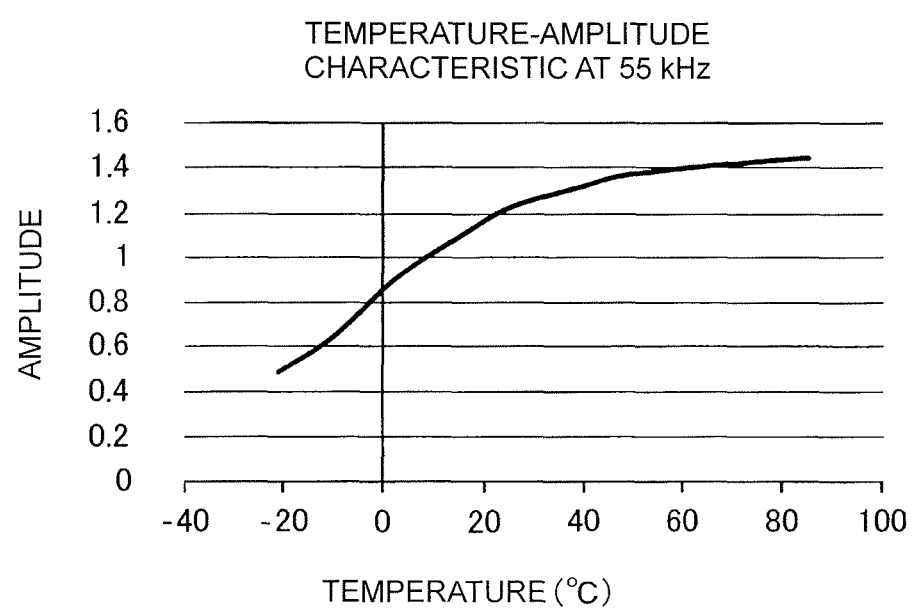
FIG. 10 is a graph illustrating a temperature-amplitude characteristic of a first piezoelectric vibrator 3 and a second piezoelectric vibrator 4 at a driving frequency of 55 kHz.
Figure 11:
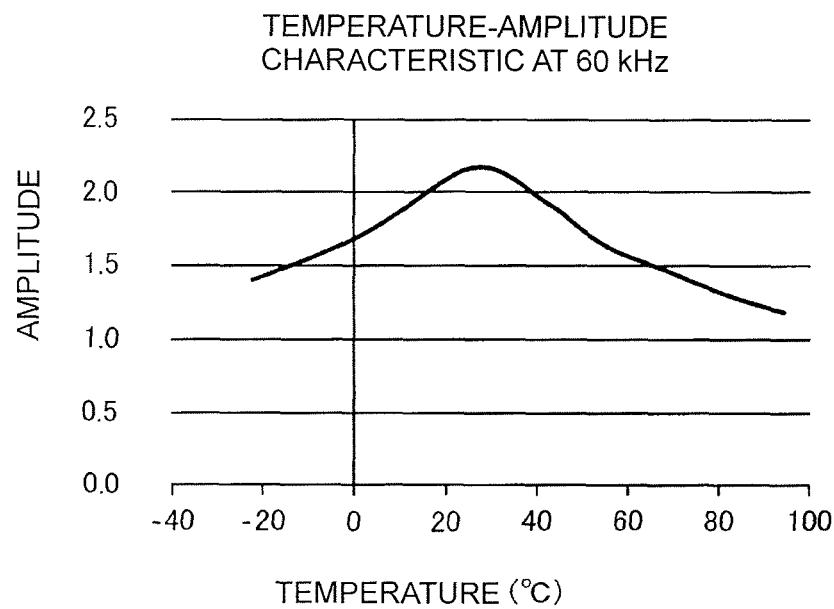
FIG. 11 is a graph illustrating a temperature-amplitude characteristic of the first piezoelectric vibrator 3 and the second piezoelectric vibrator 4 at a driving frequency of 60 kHz.
Figure 12:
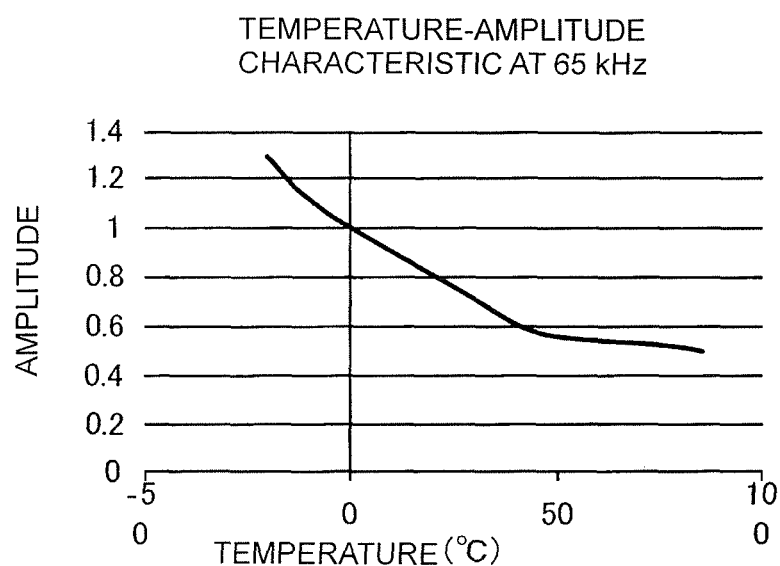
FIG. 12 is a graph illustrating a temperature-amplitude characteristic of the first piezoelectric vibrator 3 and the second piezoelectric vibrator 4 at a driving frequency of 65 kHz.

In addition, the first piezoelectric vibrator 3 and the second piezoelectric vibrator 4, which make up the ultrasonic wave generator 1, exhibit a particular temperature-amplitude characteristic at each driving frequency (each change in driving frequency). If the driving frequency is constant, the larger the amplitude, the higher the sound pressure of the generated ultrasonic waves. FIGS. 10 to 12 illustrate the temperature-amplitude characteristic of the first piezoelectric vibrator 3 and the second piezoelectric vibrator 4 at specific driving frequencies. Here, FIG. 10 illustrates the temperature-amplitude characteristic for a driving frequency of 55 kHz, FIG. 11 illustrates the temperature-amplitude characteristic for a driving frequency of 60 kHz and FIG. 12 illustrates the temperature-amplitude characteristic for a driving frequency of 65 kHz.

In the temperature-amplitude characteristic at a driving frequency of 55 kHz, as illustrated in FIG. 10, the amplitude increases as the temperature rises. In this specification, for convenience, this tendency is defined as a "positive (P) tendency".

In the temperature-amplitude characteristic for a driving frequency of 60 kHz, as illustrated in FIG. 11, the amplitude increases as temperature rises up to a certain temperature (around 25° C.) and then the amplitude decreases as the temperature rises from that certain temperature. In this specification, for convenience, this tendency is defined as a "mountain-shaped tendency".

In the temperature-amplitude characteristic at a driving frequency of 65 kHz, as illustrated in FIG. 12, the amplitude decreases as the temperature rises. In this specification, for convenience, this tendency is defined as a "negative (N) tendency".

In the ultrasonic transducer 100 of the present embodiment, considering the temperature-sound pressure characteristic for the resonance of air of λ/4 at specific frequencies (55 kHz, 60 kHz and 65 kHz) illustrated in FIG. 7 to FIG. 9 and the temperature-amplitude characteristic of the first piezoelectric vibrator 3 and the second piezoelectric vibrator 4 at specific driving frequencies (55 kHz, 60 kHz, 65 kHz) illustrated in FIG. 10 to FIG. 12, the driving frequency of the ultrasonic wave generator 1 (first piezoelectric vibrator 3 and second piezoelectric vibrator 4) is set to 65 kHz. That is, the driving frequency of the ultrasonic wave generator 1 (first piezoelectric vibrator 3 and second piezoelectric vibrator 4) of the ultrasonic transducer 100 is set to 65 kHz and the "P tendency" of the temperature-sound pressure characteristic for resonance of air of λ/4 at 65 kHz illustrated in FIG. 9 and the "N tendency" of the temperature-amplitude characteristic at a driving frequency of 65 kHz illustrated in FIG. 12, which are opposite tendencies, counterbalance each other, whereby the temperature-sound pressure characteristic is improved.

Figure 13:
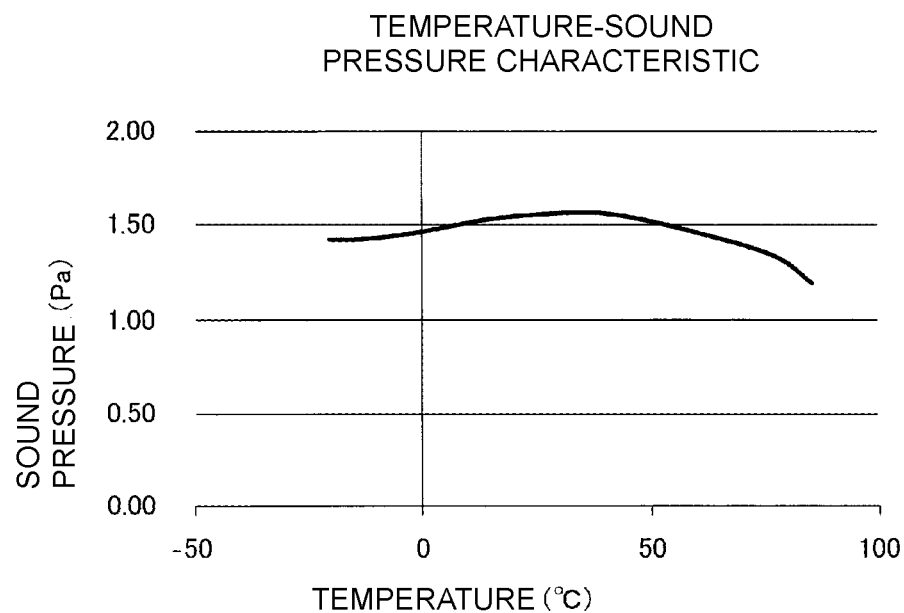
FIG. 13 is a graph illustrating a temperature-sound pressure characteristic of the ultrasonic transducer 100 according to the first embodiment of the present invention.

FIG. 13 illustrates a temperature-sound pressure characteristic of the ultrasonic transducer 100 according to the first embodiment of the present invention. As illustrated in FIG. 13, the ultrasonic transducer 100 has an excellent temperature-sound pressure characteristic from around −20° C. to around 80° C. That is, in the ultrasonic transducer 100, even if the temperature environment in which it is being used changes, the change in the output sound pressure is small.

The "N tendency" of the temperature-sound pressure characteristic for resonance of air of λ/4 at 55 kHz illustrated in FIG. 7 and the "P tendency" of the temperature-amplitude characteristic at a driving frequency of 55 kHz illustrated in FIG. 10 also counterbalance each other, whereby the temperature-sound pressure characteristic of the ultrasonic transducer 100 can be improved.

The ultrasonic transducer 100 having this structure is for example manufactured using the following method.

First, the first piezoelectric vibrator 3 and the second piezoelectric vibrator 4 are manufactured. Specifically, a plurality of piezoelectric ceramic green sheets having a certain shape are prepared, and conductive paste is printed on the surfaces thereof in certain shapes in order to form the internal electrodes 3b and 4b and the external electrodes 3c, 3d, 4c and 4d. Next, after being stacked on top of one another and subjected to pressing, the piezoelectric ceramic green sheets are subjected to firing using a certain profile, whereby the first piezoelectric vibrator 3 in which the internal electrode 3b and the external electrodes 3c and 3d are formed, and the second piezoelectric vibrator 4 in which the internal electrode 4b and the external electrodes 4c and 4d are formed are obtained. The external electrodes 3c, 3d, 4c and 4d may be formed by printing or sputtering after firing of the stacked piezoelectric ceramic green sheets.

Next, the frame 2, which has been manufactured in a certain shape in advance, is prepared, and the first piezoelectric vibrator 3 and the second piezoelectric vibrator 4 are bonded to the two main surfaces of the frame 2 using the adhesive 5a and the adhesive 5b, whereby the ultrasonic wave generator 1 is obtained.

Next, the extraction electrodes are formed using a technique such as sputtering at the four corner portions of the ultrasonic wave generator 1.

Next, the base member 7 and the cover member 8, which have been manufactured in a certain shape in advance, are prepared and after mounting the ultrasonic wave generator 1 on the base member 7 using the conductive adhesive 9, the cover member 8 is bonded to the upper main surface of the base member 7 using adhesive (not illustrated) and the ultrasonic transducer 100 is completed.

The structure of the ultrasonic transducer 100 according to the first embodiment of the present invention and an example of a method of manufacturing the ultrasonic transducer 100 have been described above. However, an ultrasonic transducer of the present invention is not limited to the above-described contents, and various modifications can be made within the gist of the present invention.

For example, in the ultrasonic transducer 100, a bimorph-type piezoelectric vibrator is used as the first piezoelectric vibrator 3 and the second piezoelectric vibrator 4, which make up the ultrasonic wave generator 1, but instead of this for example another type of vibrator such as a unimorph-type piezoelectric vibrator or a multimorph-type piezoelectric vibrator can be used. In addition, in the case where the first piezoelectric vibrator 3 and the second piezoelectric vibrator 4 are bimorph-type piezoelectric vibrators or multimorph-type piezoelectric vibrators, the first piezoelectric vibrator 3 and the second piezoelectric vibrator 4 can be connected to the outside by electrodes formed on the end surfaces of the vibrators and therefore there is no need to use a bonding wire. Consequently, along with realization of a reduction in size due to there being no need for a space for allowing connection of a bonding wire, the gap formed between the piezoelectric vibrator and the base member or the cover member can be reduced, whereby ultrasonic waves emitted from the vibrator can be more compressed and the sound pressure can be increased. In addition, the electric field applied to the piezoelectric ceramic in a bimorph type piezoelectric vibrator or a multi-morph type piezoelectric vibrator is strong and therefore the driving power is larger than in the case of a unimorph type piezoelectric vibrator. Consequently, in the case where the first piezoelectric vibrator 3 and the second piezoelectric vibrator 4 are bimorph type piezoelectric vibrators or multimorph type piezoelectric vibrators, the sound pressure can be increased.

In addition, instead of the ultrasonic wave generator 1 having the first piezoelectric vibrator 3 and the second piezoelectric vibrator 4, an ultrasonic wave generator having a single piezoelectric vibrator may be used.

In addition, the shape, size and so forth of the base member 7 and the cover member 8 are not limited and can be modified.

In addition, the shape, number, formation positions and so forth of the ultrasonic wave emission holes 8b formed in the cover member 8 are not limited, and can be modified.

Second Embodiment

Figure 14:
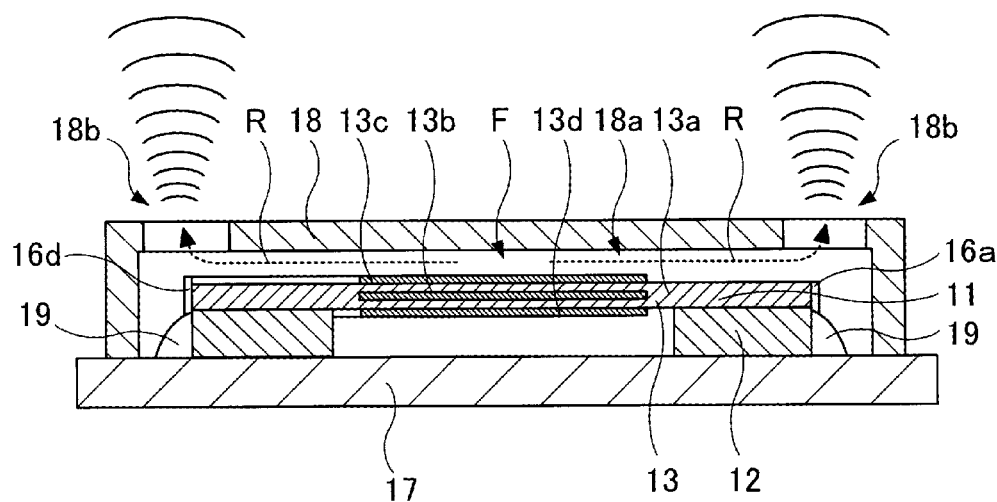
FIG. 14 is a sectional view illustrating an ultrasonic transducer 200 according to a second embodiment of the present invention.

An ultrasonic transducer 200 according to a second embodiment of the present invention is illustrated in FIG. 14. FIG. 14 is a sectional view.

In the above-described ultrasonic transducer 100 of the first embodiment, the ultrasonic wave generator 1, which includes the first piezoelectric vibrator 3 and the second piezoelectric vibrator 4, is used as an ultrasonic wave generator, whereas, in the ultrasonic transducer 200 of the present embodiment, an ultrasonic wave generator 11 having a single piezoelectric vibrator 13 is used as an ultrasonic wave generator.

The ultrasonic transducer 200 includes the ultrasonic wave generator 11 and a case composed of a base member 17 composed of for example a glass epoxy and a cover member 18 composed of for example nickel silver. The ultrasonic wave generator 11 includes a pedestal 12 and the piezoelectric vibrator 13.

The pedestal 12 is a frame having a through hole formed in a center portion thereof. The piezoelectric vibrator 13, which is a bimorph-type piezoelectric vibrator, is attached to one main surface (upper main surface) of the pedestal 12 with an adhesive (not illustrated). The other main surface of the pedestal 12 (lower main surface) is bonded to the base member 17.

The piezoelectric vibrator 13 includes a rectangular plate-shaped piezoelectric ceramic body 13a. An internal electrode 13b is formed inside the piezoelectric ceramic body 13a and external electrodes 13c and 13d are formed on the two main surfaces of the piezoelectric ceramic body 13a. The internal electrode 13b is led out to two adjacent corner portions of the piezoelectric ceramic body 13a. The external electrodes 13c and 13d are respectively led out to two adjacent corner portions of the piezoelectric ceramic body 13a to which the internal electrode 13b is not led out. The inside of the piezoelectric ceramic body 13a is polarized. Extraction electrodes (only two extraction electrodes 16a and 16d are shown in the cross sectional view of FIG. 14) are formed at the four corner portions of the piezoelectric vibrator 13.

The base member 17 has a rectangular plate-like shape. A plurality of land electrodes (not illustrated) are formed on the upper main surface of the base member 17. The extraction electrodes (only extraction electrodes 16a and 16d are shown in the cross sectional view of FIG. 14) formed at the four corner portions of the piezoelectric vibrator 13 are respectively bonded to these land electrodes with conductive adhesive 19 as small as possible so as not to affect the acoustic paths. (In FIG. 14, the conductive adhesive 19 is not illustrated in cross section but is shaded so as to be easier to see.) In this way, the ultrasonic wave generator 11 is mounted on the base member 17.

An opening 18a for allowing accommodation of the ultrasonic wave generator 11 is formed in the cover member 18 and ultrasonic wave emission holes 18b are formed in a top plate portion of the cover member 18. The periphery of the opening 18a of the cover member 18 is bonded to the upper main surface of the base member 17 with for example adhesive (not illustrated) after the ultrasonic wave generator 11 has been accommodated in the opening 18a of the cover member 18.

In the ultrasonic transducer 200, acoustic paths in which air serves as a medium are formed by the ultrasonic wave generator 11 and the case composed of the base member 17 and the cover member 18. Specifically, an acoustic path R is formed in which resonance of $\lambda/4$ is generated, where a region of the vibrating surface of the piezoelectric vibrator 13 at which the displacement is greatest is an anti-node F of the resonance and the ultrasonic wave emission holes 18b are open ends of the resonance. In FIG. 14, the acoustic path R is indicated by broken line arrows.

In the ultrasonic transducer 200 according to the second embodiment, the ultrasonic wave generator 11 (piezoelectric vibrator 13) is driven at a driving frequency such that the temperature-sound pressure characteristic for resonance of air of $\lambda/4$ and the temperature-amplitude characteristic at the driving frequency of the piezoelectric vibrator 13 have opposite tendencies and the temperature-sound pressure characteristic for resonance of air of $\lambda/4$ and the temperature-amplitude characteristic at the driving frequency of the piezoelectric vibrator 13 counterbalance each other. Therefore, the ultrasonic transducer 200 also has an excellent temperature-sound pressure characteristic.

Third Embodiment

Figure 15:
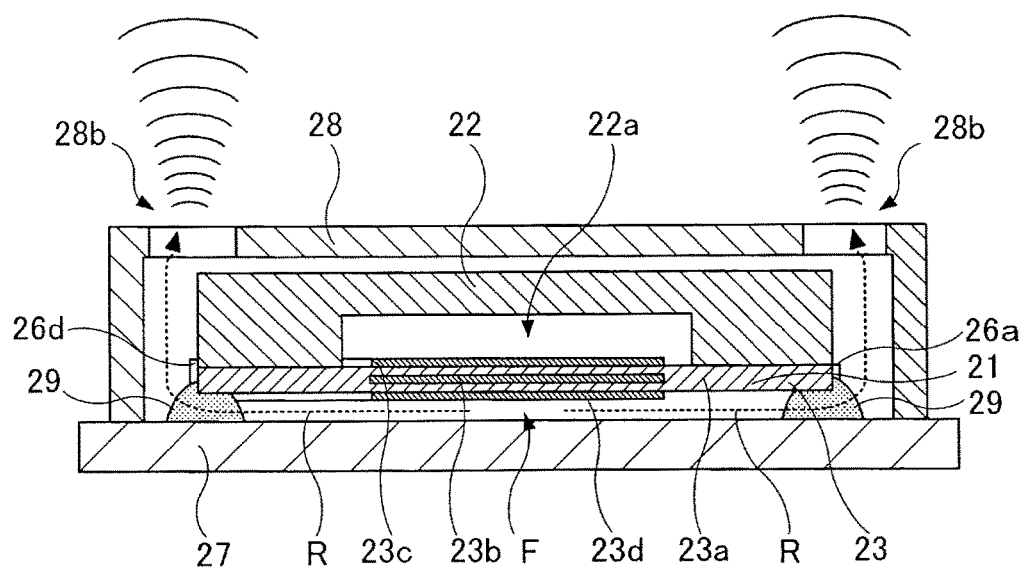
FIG. 15 is a sectional view illustrating an ultrasonic transducer 300 according to a third embodiment of the present invention.
Figure 16:
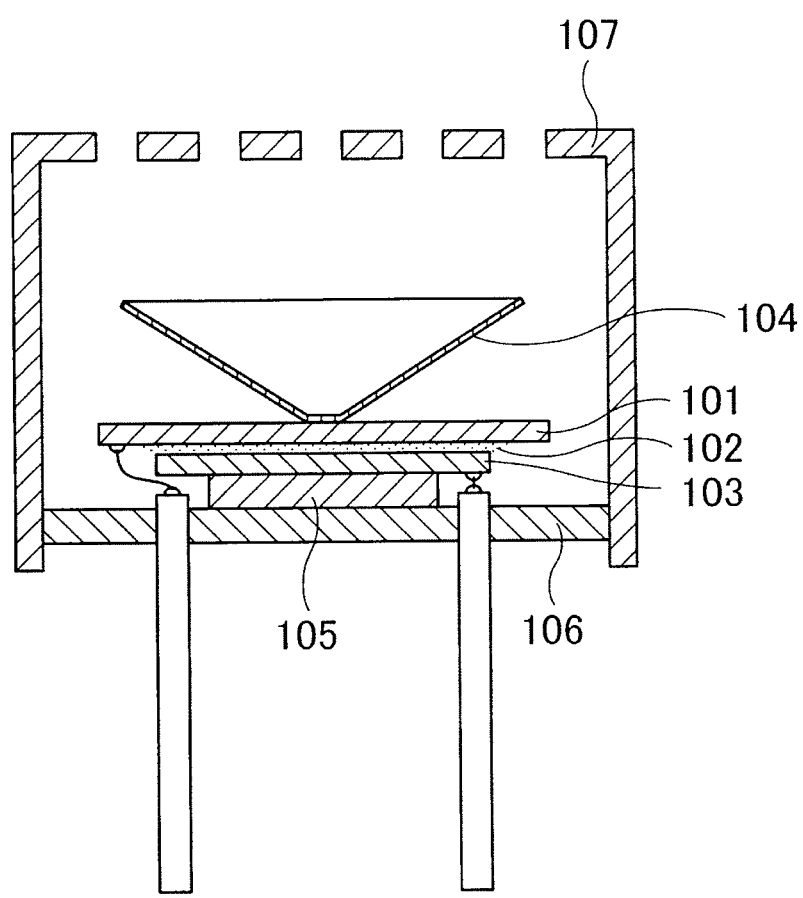
FIG. 16 is a sectional view illustrating an ultrasonic transducer 400 of the related art.

An ultrasonic transducer 300 according to a third embodiment of the present invention is illustrated in FIG. 15. FIG. 15 is a sectional view.

In the above-described ultrasonic transducer 100 of the first embodiment, the ultrasonic wave generator 1, which includes the first piezoelectric vibrator 3 and the second piezoelectric vibrator 4, is used as an ultrasonic wave generator, whereas in the ultrasonic transducer 300 of the present embodiment, an ultrasonic wave generator 21 having a single piezoelectric vibrator 23 is used as an ultrasonic wave generator.

The ultrasonic transducer 300 includes the ultrasonic wave generator 21 and a case composed of a base member 27 composed of for example a glass epoxy and a cover member 28 composed of for example nickel silver. The ultrasonic wave generator 21 includes a cavity 22 and the piezoelectric vibrator 23.

A concavity 22a is formed in the cavity 22. The piezoelectric vibrator 23, which is a bimorph-type piezoelectric vibrator, is attached to one main surface (lower main surface) of the cavity 22 with an adhesive (not illustrated).

The piezoelectric vibrator 23 includes a rectangular plate-shaped piezoelectric ceramic body 23a. An internal electrode 23b is formed inside the piezoelectric ceramic body 23a and external electrodes 23c and 23d are formed on the two main surfaces of the piezoelectric ceramic body 23a. The internal electrode 23b is led out to two adjacent corner portions of the piezoelectric ceramic body 23a. The external electrodes 23c and 23d are respectively led out to two adjacent corner portions of the piezoelectric ceramic body 23a to which the internal electrode 23b is not led out. The inside of the piezoelectric ceramic body 23a is polarized. Extraction electrodes (only two extraction electrodes 26a and 26d are shown in the cross sectional view of FIG. 15) are formed at the four corner portions of the piezoelectric vibrator 23.

The base member 27 has a rectangular plate-like shape. A plurality of land electrodes (not illustrated) are formed on the upper main surface of the base member 27. The extraction electrodes (only extraction electrodes 26a and 26d are shown in the cross sectional view of FIG. 15) formed at the four corner portions of the piezoelectric vibrator 23 are respectively bonded to these land electrodes with conductive adhesive 29 as small as possible so as not to affect the acoustic paths. (In FIG. 15, the conductive adhesive 29 is not illustrated in cross section but is shaded so as to be easier to see.) In this way, the ultrasonic wave generator 21 is mounted on the base member 27.

An opening 28a for allowing accommodation of the ultrasonic wave generator 21 is formed in the cover member 28 and ultrasonic wave emission holes 28b are formed in a top plate portion of the cover member 28. The periphery of the opening 28a of the cover member 28 is bonded to the upper main surface of the base member 27 with for example adhesive (not illustrated) after the ultrasonic wave generator 21 has been accommodated in the opening 28a of the cover member 28.

In the ultrasonic transducer 300, acoustic paths in which air serves as a medium are formed by the ultrasonic wave generator 21 and the case composed of the base member 27 and the cover member 28. Specifically, an acoustic path R is formed in which resonance of $\lambda/4$ is generated, where a region of the vibrating surface of the piezoelectric vibrator 23 at which the displacement is greatest is an anti-node F of the resonance and the ultrasonic wave emission holes 28b are open ends of the resonance. In FIG. 15, the acoustic path R is indicated by broken line arrows.

In the ultrasonic transducer 300 according to the third embodiment, the ultrasonic wave generator 21 (piezoelectric vibrator 23) is driven at a driving frequency such that the temperature-sound pressure characteristic for resonance of air of $\lambda/4$ and the temperature-amplitude characteristic at the driving frequency of the piezoelectric vibrator 23 have opposite tendencies and the temperature-sound pressure characteristic for resonance of air of $\lambda/4$ and the temperature-amplitude characteristic at the driving frequency of the piezoelectric vibrator 23 counterbalance each other. Therefore, the ultrasonic transducer 300 also has an excellent temperature-sound pressure characteristic.

REFERENCE SIGNS LIST 1, 11, 21: ultrasonic wave generator
2: frame
2a: through hole
3: first piezoelectric vibrator
3a, 4a, 13a, 23a: piezoelectric ceramic body
3b, 4b, 13b, 23b: internal electrode
3c, 3d, 4c, 4d, 13c, 13d, 23c, 23d: external electrode
4: second piezoelectric vibrator
5a, 5b: adhesive
6a, 6d, 16a, 16d, 26a, 26d: extraction electrode
7, 17, 27: base member
8, 18, 28: cover member
8a, 18a, 28a: opening
8b, 18b, 28b: ultrasonic wave emission hole
9, 19, 29: conductive adhesive
12: pedestal
13, 23: piezoelectric vibrator
22: cavity
22a: concavity
100, 200, 300: ultrasonic transducer
R1, R2, R: acoustic path
F1, F2, F: anti-node of resonance of air of $\lambda/4$

The invention claimed is:
1. An ultrasonic transducer comprising:
a case having a plurality of ultrasonic wave emission holes;
an ultrasonic wave generator including a piezoelectric vibrator and being disposed in the case such that a plurality of acoustic paths extend from the piezoelectric vibrator to the plurality of ultrasonic wave emission holes, respectively,
wherein the piezoelectric vibrator is configured to generate an ultrasonic wave that creates air resonance in the acoustic path,
wherein all of the acoustic paths extend from a center region of a surface of the piezoelectric vibrator at which displacement is greatest during excitation to the plurality of ultrasonic wave emission holes and are equal in distance to each other, and wherein the piezoelectric vibrator is configured to be driven at a driving frequency at which a temperature-sound pressure characteristic for the air resonance and a temperature-amplitude characteristic at the driving frequency have opposite tendencies.

2. The ultrasonic transducer according to claim 1, wherein the air resonance is a resonance of $\lambda/4$.

3. The ultrasonic transducer according to claim 1, wherein the driving frequency of the piezoelectric vibrator is shifted away from the frequency at which sound pressure of the air resonance peaks at 25° C.

4. The ultrasonic transducer according to claim 1, wherein the piezoelectric vibrator comprises a rectangular plate-shaped piezoelectric ceramic body.

5. The ultrasonic transducer according to claim 4, wherein the ceramic body comprises an internal electrode and a pair of external electrodes disposed on the upper and lower surfaces of the ceramic body, respectively.

6. The ultrasonic transducer according to claim 5, further comprising a pedestal with a through hole that is coupled to the case and configured to support the ceramic body.

7. The ultrasonic transducer according to claim 6, wherein the pair of external electrodes are disposed in the through hole of the pedestal.

8. The ultrasonic transducer according to claim 1, further comprising:
a cavity disposed in the case that includes a concavity,
wherein the piezoelectric vibrator is attached to a lower surface of the cavity with at least a portion of the piezoelectric vibrator disposed adjacent the concavity.

9. An ultrasonic transducer comprising:
a case having a plurality of ultrasonic wave emission holes; and
an ultrasonic wave generator that includes a first piezoelectric vibrator and a second piezoelectric vibrator,
wherein the ultrasonic wave generator is disposed in the case to define a plurality of first acoustic paths that extend from the first piezoelectric vibrator to the plurality of ultrasonic wave emission holes, respectively, and a plurality of second acoustic paths that extend from the second piezoelectric vibrator to the plurality of ultrasonic wave emission holes, respectively,
wherein each of the piezoelectric vibrators are configured to generate an ultrasonic wave that creates air resonance in the first and second acoustic paths, respectively,
wherein all of the first acoustic paths extend from a center region of a surface of the first piezoelectric vibrator at which displacement is greatest during excitation to the plurality of ultrasonic wave emission holes and are equal in distance to each other, and
wherein all of the second acoustic paths extend from a center region of a surface of the second piezoelectric vibrator at which displacement is greatest during excitation to the plurality of ultrasonic wave emission holes and are equal in distance to each other.

10. The ultrasonic transducer according to claim 9, wherein each of the piezoelectric vibrators is configured to be driven at a driving frequency at which a temperature-sound pressure characteristic for the air resonance and a temperature-amplitude characteristic at the driving frequency have opposite tendencies.

11. The ultrasonic transducer according to claim 9, wherein the first piezoelectric vibrator and the second piezoelectric vibrator are configured to be driven using a buckling tuning fork vibration mode in which the first piezoelectric vibrator and the second piezoelectric vibrator vibrate with opposite phases to each other at the same frequency.

12. The ultrasonic transducer according to claim 10, wherein the first piezoelectric vibrator and the second piezoelectric vibrator are configured to be driven using a buckling tuning fork vibration mode in which the first piezoelectric vibrator and the second piezoelectric vibrator vibrate with opposite phases to each other at the driving frequency.

13. The ultrasonic transducer according to claim 9, wherein the first piezoelectric vibrator comprises a plate-shaped ceramic body and is bonded to a first main surface of the case and the second piezoelectric vibrator comprises a plate-shaped ceramic body and is bonded to a second main surface of the case.

14. The ultrasonic transducer according to claim 13, wherein each of the first and second piezoelectric vibrators comprises an internal electrode and first and second external electrodes disposed on the upper and lower surfaces of the plate-shaped ceramic bodies of the respective piezoelectric vibrators.

15. The ultrasonic transducer according to claim 14, wherein the plate-shaped ceramic body of the first piezoelectric vibrator is polarized and the direction of polarization between the first external electrode and the internal electrode and the direction of polarization between the second external electrode and the internal electrode are the same.

16. The ultrasonic transducer according to claim 15, wherein the plate-shaped ceramic body of the second piezoelectric vibrator is polarized and the direction of polarization between the first external electrode and the internal electrode and the direction of polarization between the second external electrode and the internal electrode are the same.

17. The ultrasonic transducer according to claim 15, wherein the direction of polarization of the plate-shaped ceramic body of the first piezoelectric vibrator is opposite to the direction of polarization of the plate-shaped ceramic body of the second piezoelectric vibrator.

18. The ultrasonic transducer according to claim 9, wherein the air resonance in the first and second acoustic paths is a resonance of $\lambda/4$.

19. The ultrasonic transducer according to claim 10, wherein the driving frequency of the piezoelectric vibrator is shifted away from the frequency at which sound pressure of the air resonance peaks at 25° C.

20. The ultrasonic transducer according to claim 10,
wherein respective distances from a center of the surface of the first piezoelectric vibrator to all of the ultrasonic wave emission holes are equal to each other,
wherein respective distances from a center region of the surface of the second piezoelectric vibrator to all of the plurality of ultrasonic wave emission holes are equal to each other.

21. The ultrasonic transducer according to claim 10, wherein lengths of the distances of the first acoustic paths are different than lengths of the distances of the second acoustic paths.

* * * * *